United States Patent
Arai et al.

(10) Patent No.: US 11,761,084 B2
(45) Date of Patent: Sep. 19, 2023

(54) SUBSTRATE PROCESSING APPARATUS AND METHOD OF PROCESSING SUBSTRATE

(71) Applicant: ASM IP Holding B.V., Almere (NL)

(72) Inventors: Hiroki Arai, Fuchu (JP); Yukihiro Mori, Machida (JP); Yuya Nonaka, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 1092 days.

(21) Appl. No.: 15/368,104

(22) Filed: Dec. 2, 2016

(65) Prior Publication Data
US 2018/0155836 A1 Jun. 7, 2018

(51) Int. Cl.
| | | |
|---|---|---|
| *C23C 16/455* | (2006.01) | |
| *C23C 16/44* | (2006.01) | |
| *C23C 16/505* | (2006.01) | |
| *C23C 16/452* | (2006.01) | |

(52) U.S. Cl.
CPC .... *C23C 16/45565* (2013.01); *C23C 16/4412* (2013.01); *C23C 16/452* (2013.01); *C23C 16/505* (2013.01)

(58) Field of Classification Search
CPC .......................... C23C 16/45565; C23C 16/452
See application file for complete search history.

(56) References Cited

U.S. PATENT DOCUMENTS

| | | | |
|---|---|---|---|
| 8,178,447 B1* | 5/2012 | Fan ...................... | H01L 51/0525 257/E21.24 |
| 9,123,510 B2 | 9/2015 | Nakano et al. | |
| 2007/0289722 A1* | 12/2007 | Diekmann ........... | B01D 5/0012 165/114 |
| 2012/0328780 A1* | 12/2012 | Yamagishi ........... | G05D 7/0641 427/255.28 |

(Continued)

FOREIGN PATENT DOCUMENTS

| | | |
|---|---|---|
| JP | 2015-002349 A | 1/2015 |
| KR | 10-2008-0095105 A | 10/2008 |
| KR | 10-2014-0145095 A | 12/2014 |

OTHER PUBLICATIONS

An Office Action mailed by the Korean Intellectual Property Office dated Sep. 13, 2021, which corresponds to Korean Patent Application No. 10-2017-0155187 and is related to U.S. Appl. No. 15/368,104; with English language translation.

(Continued)

*Primary Examiner* — Parviz Hassanzadeh
*Assistant Examiner* — Nathan K Ford
(74) *Attorney, Agent, or Firm* — Studebaker & Brackett PC

(57) ABSTRACT

A substrate processing apparatus includes a stage provided in a chamber, a shower head in which a plurality of slits are formed and which is opposed to the stage, a first gas supply part which supplies a first gas to a space between the stage and the shower head via the plurality of slits, and a second gas supply part which supplies a second gas which is not a (Continued)

noble gas to a region below the stage, wherein the second gas is the same gas as one of a plurality of kinds of gases constituting the first gas in a case where the first gas is a mixture gas constituted of the plurality of kinds of gases, and the second gas is the same gas as the first gas in a case where the first gas is a single kind of gas.

5 Claims, 4 Drawing Sheets
(1 of 4 Drawing Sheet(s) Filed in Color)

(56) References Cited

U.S. PATENT DOCUMENTS

2014/0367359 A1* 12/2014 Nakano ............ H01J 37/32449
216/67

OTHER PUBLICATIONS

An Office Action mailed by China National Intellectual Property Administration dated Nov. 18, 2022, which corresponds to Chinese Patent Application No. 201710984157.6 and is related to U.S. Appl. No. 15/368,104; with English language translation.

An Office Action; "Notice of Reasons for Refusal", mailed by the Japanese Patent Office dated Jun. 8, 2021, which corresponds to Japanese Patent Application No. 2017-199731 and is related to U.S. Appl. No. 15/368,104; with English language translation.

* cited by examiner

| Thick-TEOS condition AL-HB electrical discharge | | Flow [slpm] | | | | | |
|---|---|---|---|---|---|---|---|
| | | 0.20 | 1.50 | 3.00 | 5.00 | 6.00 | 7.00 |
| Second Gas | Seal-Ar | ○ | ○ | × | × | × | × |
| | Seal-He | ○ | ○ | ○ | × | × | × |
| | Seal-$O_2$ | ○ | ○ | ○ | ○ | ○ | ○ |

○Electrical Discharge not observed under the stage
×Electrical Discharge observed under the stage

| Seal $O_2$ [slm] (Second Gas) | | | |
|---|---|---|---|
| 0.2 | 1.5 | 3 | 6 |

SUBSTRATE PROCESSING APPARATUS AND METHOD OF PROCESSING SUBSTRATE

BACKGROUND OF THE INVENTION

Field of the Invention

The present invention relates to a substrate processing apparatus used to process a substrate such as a semiconductor wafer and to a method of processing a substrate by using the substrate processing apparatus.

Background Art

U.S. Pat. No. 9,123,510B2 discloses a substrate processing apparatus in which a process gas is supplied to a processing space via openings in a gas diffusion plate.

In some cases, a substrate supported on a stage is processed by supplying a cleaning gas or a film forming gas from above the stage. For example, in such cases, an inert gas such as He or Ar is caused to flow through a region below the stage so that the gas supplied from above the stage does not flow below the stage in a roundabout way. The gas caused to flow through the region below the stage is referred to as "sealing gas" in some cases. When the amount of the gas supplied from above the stage is increased, it is necessary to also increase the rate of flow of the sealing gas.

If the rate of flow of the sealing gas is increased, electric discharge occurs in the region below the stage. In a case where the profile of a formed film is controlled by adjusting the rate of flow of the sealing gas, the problem of occurrence of electric discharge in the region below the stage also arises. In some cases of performing plasma CVD, radiofrequency (RF) power is increased in order to increase the speed of film forming with the substrate processing apparatus. If RF power is increased, a margin for electric discharge in the region below the stage becomes smaller, that is, electric discharge can occur more easily. Under these circumstances, there is a demand for a substrate processing apparatus and method capable of inhibiting electric discharge in a region below a stage.

SUMMARY OF THE INVENTION

In view of the above-described problem, an object of the present invention is to provide a substrate processing apparatus and method capable of inhibiting electric discharge in a region below a stage.

The features and advantages of the present invention may be summarized as follows.

According to one aspect of the present invention, a substrate processing apparatus includes a chamber, a stage provided in the chamber, a shower head in which a plurality of slits are formed, and which is opposed to the stage, a first gas supply part which supplies a first gas to a space between the stage and the shower head via the plurality of slits, and a second gas supply part which supplies a second gas which is not a noble gas to a region below the stage, wherein the second gas is the same gas as one of a plurality of kinds of gases constituting the first gas in a case where the first gas is a mixture gas constituted of the plurality of kinds of gases, and the second gas is the same gas as the first gas in a case where the first gas is a single kind of gas.

According to another aspect of the present invention, a method of processing a substrate includes a processing process of performing plasma processing on a substrate on a stage in a chamber by supplying a first gas to a space between a shower head and the stage through a plurality of slits in the shower head, by simultaneously supplying a second gas which is not a noble gas to a region below the stage, and by applying radiofrequency power to the shower head while the first and second gases are being supplied, wherein the second gas is the same gas as one of a plurality of kinds of gases constituting the first gas in a case where the first gas is a mixture gas constituted of the plurality of kinds of gases, and the second gas is the same gas as the first gas in a case where the first gas is a single kind of gas.

Other and further objects, features and advantages of the invention will appear more fully from the following description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENT

Figure 1:
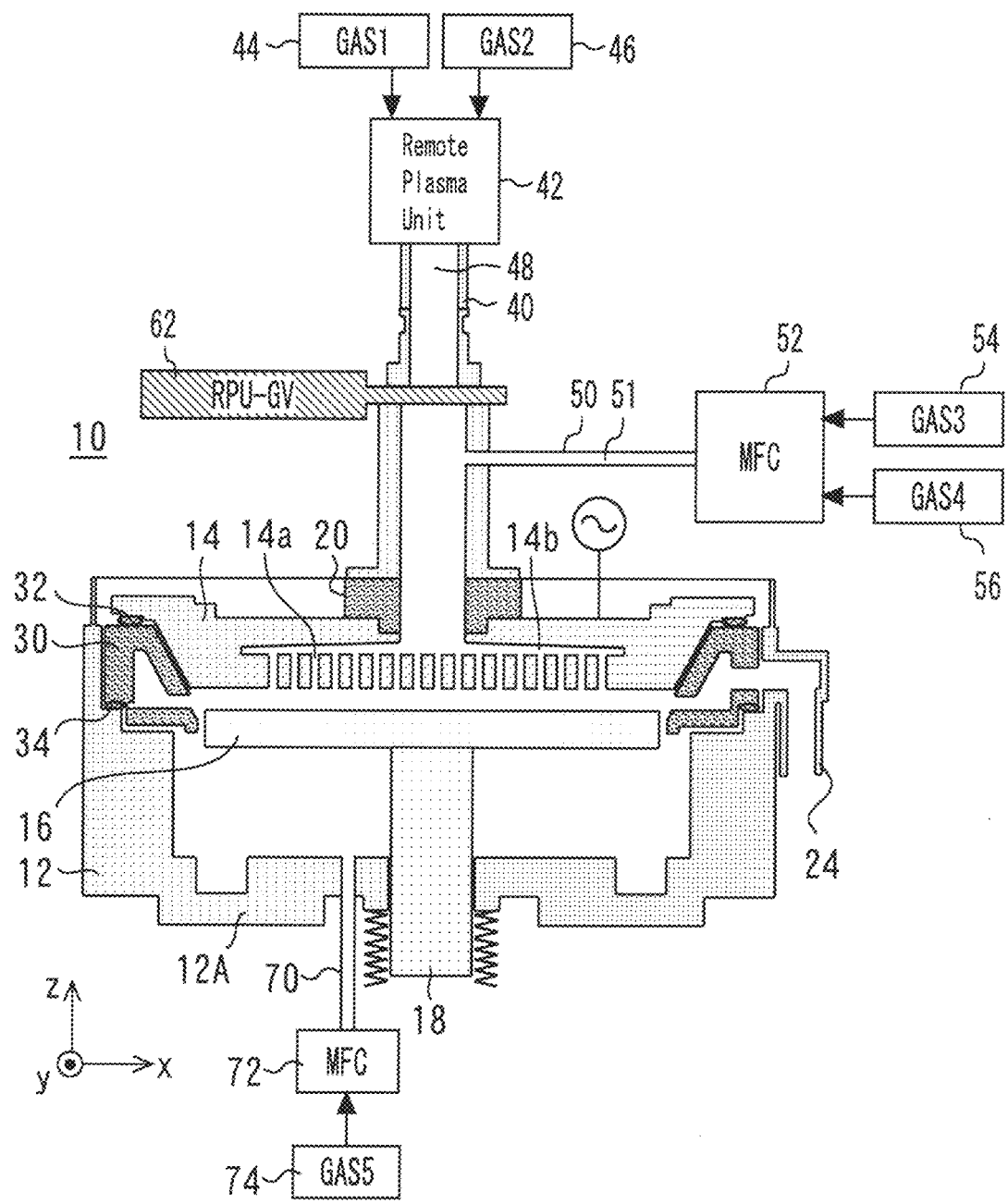
FIG. 1 is a sectional view of a substrate processing apparatus.

A substrate processing apparatus and a substrate processing method according to an embodiment of the present invention will be described with reference to the drawings. Components identical or corresponding to each other are assigned the same reference characters, and repeated description for them in some cases is avoided.

Embodiment

FIG. 1 is a sectional view of a substrate processing apparatus according to an embodiment of the present invention. The substrate processing apparatus has a chamber (reactor chamber) 12. A stage 16 is provided in the chamber 12. The stage 16 is, for example, a susceptor incorporating a heater. The stage 16 is supported on a slide shaft 18 and is grounded. A shower head 14 is provided above and in opposition to the stage 16. A plurality of slits 14a are formed in the shower head 14. In the shower head 14, a diffusion space 14b which communicates with the plurality of slits 14a is provided. The stage 16 and the shower head 14 form a plane-parallel structure.

A gas exhaust part 24 is provided on a side surface of the chamber 12. The gas exhaust part 24 is provided for the purpose of discharging gases including a material gas used for film forming. A vacuum pump is therefore connected to the gas exhaust part 24.

The stage 16 is surrounded by an exhaust duct 30 having such a shape as to surround the stage 16 as viewed in plan. The exhaust duct 30 is formed, for example, of ceramic. An O-ring 32 suitably compressed is provided between the exhaust duct 30 and the shower head 14. An O-ring 34 suitably compressed is provided between the exhaust duct 30 and the chamber 12. The exhaust duct 30 has two functions: a first function to electrically separate the shower head 14 to which electric power is applied and the chamber 12 at GND potential from each other, and a second function to lead to the gas exhaust part 24 a gas supplied to the chamber 12.

A transport tube 40 is connected to the shower head 14, with an insulating part 20 interposed therebetween. The transport tube 40 is a tube extending along a z-direction, i.e., a vertical direction. In the transport tube 40, a passage extending generally vertically and communicating with the diffusion space 14b above the slits 14a is provided.

A remote plasma unit 42 is provided on an upper end of the transport tube 40. Gas sources 44 and 46 from which a cleaning gas to be used to clean the chamber 12 and other components is supplied are connected to the remote plasma unit 42. The gas supplied from the gas sources 44 and 46 to the remote plasma unit 42 are changed into a plasma state by the remote plasma unit 42 to produce a reactive species. This reactive species is used for cleaning of the chamber 12 and other components.

A gas supply line 50 is connected to a side surface of the transport tube 40 generally perpendicularly to the transport tube 40. In the gas supply line 50, a passage 51 which communicates with a space 48 in the transport tube 40 is provided. A mass flow controller 52 (hereinafter referred to as MFC) is connected to the gas supply line 50, and gas sources 54 and 56 are connected to the MFC 52. The gas sources 54 and 56 supply material gases to be used for film forming. For example, the gas sources 54 and 56 supply $O_2$ gas and tetraethylorthosilicate (TEOS) gas. The gases from the gas sources 54 and 56 are supplied into the passage 51 in the gas supply line 50 while being pressure-controlled by the MFC 52, and move generally horizontally in the passage 51 to reach the space 48 in the transport tube 40.

A remote plasma unit (RPU) gate valve 62 is connected to a side surface of the transport tube 40. The RPU gate valve 62 is provided for the purpose of preventing mixing of the cleaning gas with the material gas by shutting off the communication between the remote plasma unit 42 and the chamber 12.

A gas supply tube 70 is connected to a bottom portion 12A of the chamber 12. An MFC 72 is connected to the gas supply tube 70. A gas source 74 is connected to the MFC 72. The gas source 74 supplies, for example, $O_2$ gas. The gas from the gas source 74 is supplied to a region below the stage 16 via the gas supply tube 70 while being pressure-controlled by the MFC 72. A plurality of gas supply tubes 70 may be provided in the bottom portion 12A of the chamber 12, or one gas supply tube 70 may be provided just by the side of the slide shaft 18.

The gas supplied to the space between the stage 16 and the shower head 14 via the plurality of slits 14a will be referred to as the first gas. The first gas supply part that supplies the first gas is the MFC 52 in the present embodiment. The gas supplied to the region below the stage 16 via the gas supply tube 70 will be referred to as the second gas. The second gas supply part that supplies the second gas is the MFC 72 in the present embodiment.

Figure 2:
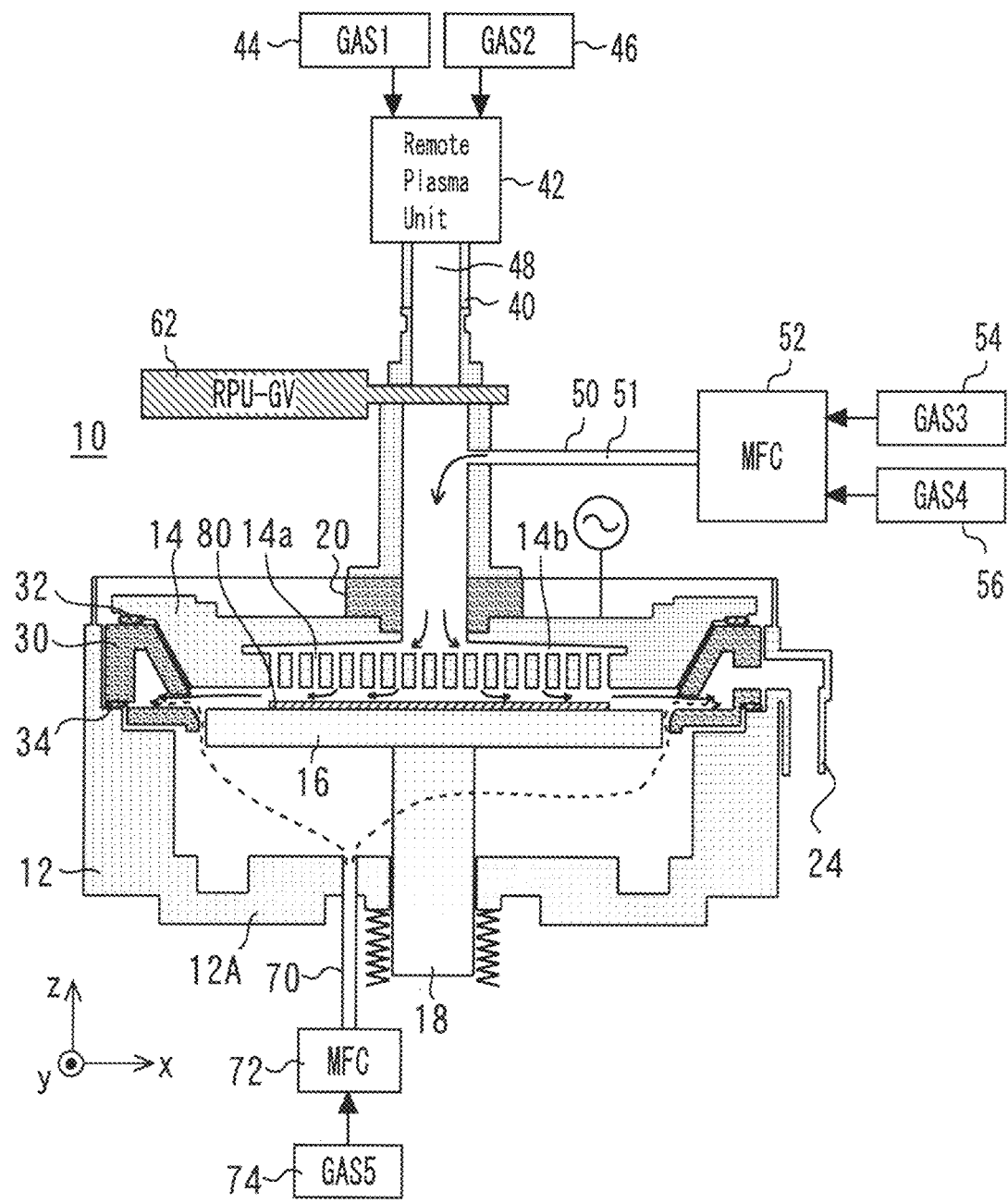
FIG. 2 is a diagram showing flows of gases when a substrate is processed.

A method of processing a substrate by using the substrate processing apparatus according to the embodiment of the present invention will subsequently be described. FIG. 2 is a diagram showing flows of gases when a substrate is processed. First, in the substrate processing method according to the embodiment of the present invention, a substrate 80 is placed on the stage 16. The substrate 80 is, for example, a Si wafer. The substrate 80 may be an object to be processed other than the Si wafer. Next, a processing process in which plasma processing is performed on the substrate 80 is executed. In the processing process, the first gas is supplied from the MFC 52 to the space between the shower head 14 and the stage 16 through the slits 14a and the second gas is simultaneously supplied from the MFC 72 to the region below the stage 16 via the gas supply tube 70. In this state, radiofrequency waves (RF power) are applied to the shower head 14. Plasma processing is thus performed on the substrate 80.

In FIG. 2, the flow of the first gas is indicated by arrows. The first gas used for processing on the substrate 80 moves radially and horizontally on the substrate 80 and enters the exhaust duct 30. Broken line arrows in FIG. 2 indicate the flow of the second gas. The second gas enters the exhaust duct 30 from below the stage 16 by flowing between the stage 16 and the exhaust duct 30. The first gas and the second gas are thereafter discharged out of the chamber 12 through the exhaust duct 30.

In the embodiment of the present invention, a mixture gas constituted of $O_2$ and TEOS is produced in the MFC 52 and is supplied as the first gas onto the substrate 80. Also, the $O_2$ gas pressure-controlled by the MFC 72 is supplied as the second gas to the region below the stage 16. Thus, the first gas is a mixture gas constituted of two gases, and $O_2$ gas, which is one of the gases constituting the mixture gas, is used as the second gas. From the viewpoint of preventing the first gas from flowing below the stage 16 in a roundabout way, it is preferable to set the proportions of the first gas and the second gas to 10:1 to 50:1.

It is demanded that the second gas function as a sealing gas for inhibiting the first gas from flowing below the stage 16 in a roundabout way, and inhibit electric discharge in the region below the stage 16.

Figures 3, 4:
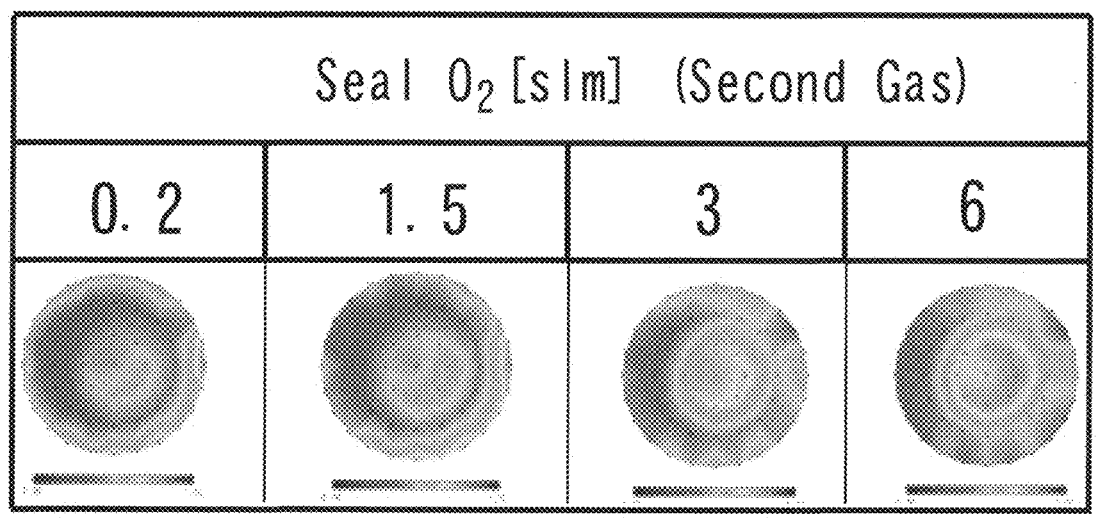
FIG. 3 is a table in which the relationship between the second gas and the occurrence/nonoccurrence of electric discharge.
FIG. 4 is a diagram showing profiles of films.

FIG. 3 is a table in which the relationship between the second gas and the occurrence/nonoccurrence of electric discharge. The degrees of dischargeability in cases where Ar, He and $O_2$ were respectively used as the second gas in the above-described substrate processing apparatus were compared. In this experiment, $O_2$ gas and TEOS were provided as the first gas at the flow rate of 27.0[slpm] and 33[g/min] respectively. The gap between shower head 14 and the stage 16 is set at 8.4 mm. The rate of flow of the second gas was changed from 0.20 to 7.00 [slpm]. Under this condition, the check on the occurrence/nonoccurrence of electric discharge in the region below the stage 16 was made when a plasma was generated between the stage 16 and the shower head 14 by applying HRF 1600 W and LRF 840 W to the shower head 14.

When Ar is caused to flow as the second gas at a rate of 3.00 [slpm] or higher, electric discharge occurs in the region below the stage 16. When He is caused to flow as the second gas at a rate of 5.00 [slpm] or higher, electric discharge occurs in the region below the stage 16. In the embodiment of the present invention, $O_2$ gas is used as the second gas and, therefore, no electric discharge occurs even when the flow rate is increased to 7.00 [slpm]. Thus, in the substrate processing method according to the embodiment of the present invention, electric discharge in the region below the stage 16 can be inhibited while the rate of flow of the second gas is increased to prevent the first gas from flowing below the stage 16 in a roundabout way. Inhibition of electric discharge in the region below the stage 16 enables avoiding a loss of the plasma and producing the plasma only between the stage 16 and the shower head 14.

FIG. 4 is a diagram showing profiles of films formed by the substrate processing method according to the embodiment of the present invention. The film profiles were obtained by changing the rate of flow of $O_2$ gas supplied as the second gas from 0.2 to 6 [slm] while the rate of flow of the first gas including $O_2$ gas and TEOS were fixed at 27.0[slpm] and 33[g/min] respectively. The gap between shower head 14 and the stage 16 is set at 8.4 mm. Plasma was generated between the stage 16 and the shower head 14 by applying HRF 1600 W and LRF 840 W. When the rate of flow of the second gas was as low as 0.2 to 1.5 [slm], the film profile tended to be concaved. That is, the film thickness was larger at an annular portion of the substrate than at a central portion of the substrate surrounded by the annular portion. When the rate of flow of the second gas was as large as 3 to 6 [slm], the film profile tended to be convexed. That is, the film thickness was smaller at an annular portion of the substrate than at a central portion of the substrate surrounded by the annular portion. It is thought that when the rate of flow of the second gas is increased, the flow velocity right above the central portion of the substrate is reduced and film forming at the central portion progresses at the central portion.

Consequently, the substrate processing method according to the embodiment of the present invention enables controlling the film profile by changing the rate of flow of the second gas while inhibiting electric discharge in the region below the stage 16.

Figure 5:
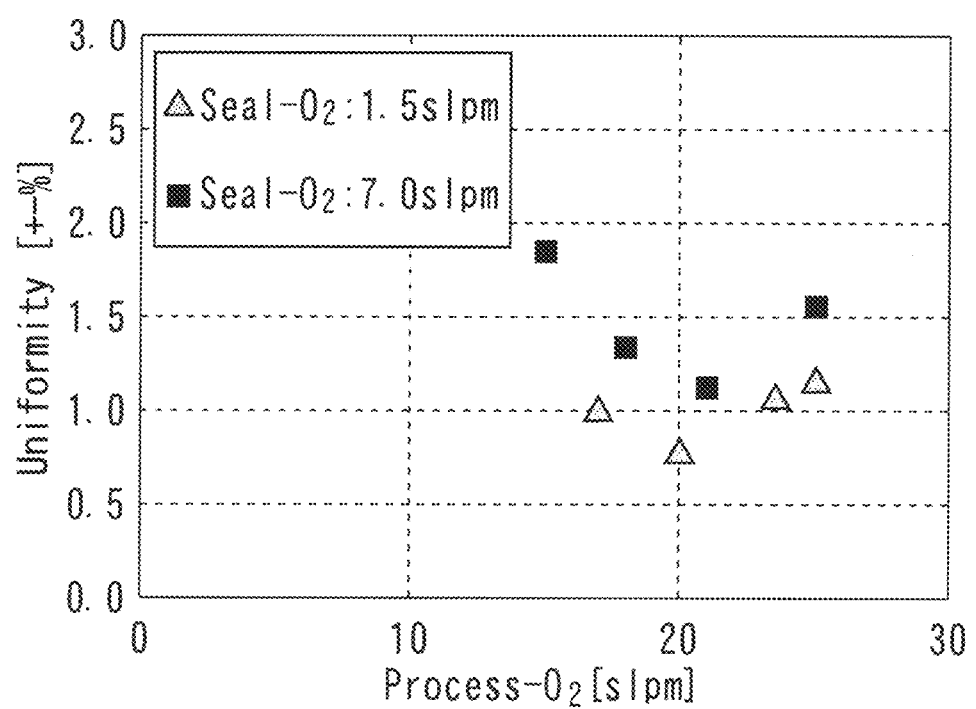
FIG. 5 is a graph showing the rate of flow of the first gas and the film thickness uniformity.

FIG. 5 is a graph showing the rate of flow of the first gas and the film thickness uniformity. Data shown in FIG. 5 was obtained by changing the rate of flow of $O_2$ gas used as the first gas while the rate of flow of $O_2$ gas used as the second gas was fixed. "Uniformity" on the ordinate of FIG. 5 represents the film thickness uniformity in the substrate surface. If the maximum of film thicknesses at a plurality of measurement points is "max"; the minimum of the film thicknesses at the plurality of measurement points is "min"; and the average of the film thicknesses at the plurality of measurement points is "ave", the uniformity is defined as ((max−min)/ave)×50

It is, therefore, preferable that the uniformity be a small value. From FIG. 5, it can be understood that the uniformity is changed when the rate of flow of the first gas is changed. The uniformity can therefore be controlled by selecting an optimum flow rate as the rate of flow of the first gas. From FIG. 5, it can be understood that a minimum value for the uniformity can be obtained by selecting 20 [slpm] as a rate of flow of the first gas.

From FIGS. 4 and 5, it can be understood that profile control on a film formed on the substrate can be performed by adjusting the rates of flows of the first and second gases. In the processing process, therefore, film forming can be performed in such a manner that the film thickness is larger at a central portion of the substrate 80 than at an annular portion of the substrate 80 surrounding the central portion or in such a manner that the film thickness is smaller at the central portion than at the annular portion. Needless to say, a desired profile can be obtained by changing both the rates of flows of the first and second gases.

The substrate processing apparatus and the substrate processing method according to the embodiment of the present invention can be variously modified. For example, a gas other than $O_2$ gas may be used as the second gas. In a case where the first gas is a mixture gas constituted of a plurality of kinds of gas, the same gas as one of the gases constituting the mixture gas is used as the second gas. In a case where the first gas is a single kind of gas, the same gas as the first gas is used as the second gas. An influence of the second gas on the process can be avoided in this way.

It is thought that if the second gas is an easily decomposable gas, electric discharge occurs in the region below the stage 16. There is, therefore, a need to select as the second gas a gas other than noble gases. It is thought that electric discharge in the region below the stage 16 can be inhibited by selecting, for example, as the second gas, a gas having a high electronegativity or a gas such as $N_2$ gas having a triple bond. For example, electric discharge in the region below the stage 16 can be inhibited by using $N_2$ gas as the second gas in a case where $N_2$ gas is contained in the first gas, by using TEOS as the second gas in a case where TEOS is contained in the first gas, or by using silane as the second gas in a case where silane is contained in the first gas. Some other gas not easily decomposable in comparison with noble gases may be used as the second gas.

The profile of a 1 µm-thick film formed by the substrate processing method according to the embodiment of the present invention and the profile of a 5 µm-thick film formed by the same substrate processing method differ from each other. To obtain a desired film profile no matter what the film thickness, the rate of flow of the second gas and/or the rate of flow of the first gas may be changed with respect to time in the processing process. In such a case, the flow rate can be changed with respect to time with no change in film quality. Since the film profile can be controlled by changing the rates of flows of the first and second gases as described above, the film profile with a first film thickness and the film profile with a second film thickness that is larger than the first film thickness can be made substantially identical to each other by changing the rate of flow of the second gas with respect to time or by changing the rate of flow of the first gas with respect to time.

Processing in the processing process is not limited to film forming. In the processing process, any processing using plasma can be performed. For example, the substrate surface may be modified in the processing process.

According to the present invention, a gas in which electric discharge cannot occur easily in comparison with a noble gas is supplied to a region below the stage, thereby inhibiting electric discharge in the region below the stage.

Obviously many modifications and variations of the present invention are possible in the light of the above teachings. It is therefore to be understood that within the scope of the appended claims the invention may be practiced otherwise than as specifically described.

What is claimed is:

1. A substrate processing apparatus comprising:
a chamber;
a stage provided in the chamber;
a shower head in which a plurality of slits are formed, and which is opposed to the stage;
a first gas supply part which supplies a first gas to a space between the stage and the shower head via the plurality of slits, the first gas being film forming gas;
a first gas source storing the first gas, the first gas source is connected to the first gas supply part;
a second gas supply part which supplies a second gas which is not a noble gas to a region below the stage; and
a second gas source storing the second gas, the second gas source is connected to the second gas supply part,
wherein the second gas is the same gas as one of a plurality of kinds of gases constituting the first gas in a case where the first gas is a mixture gas constituted of the plurality of kinds of gases, and the second gas is the same gas as the first gas in a case where the first gas is a single kind of gas.

2. The substrate processing apparatus according to claim 1, wherein the second gas is $O_2$, $N_2$, TEOS or silane.

3. The substrate processing apparatus according to claim 1, wherein the first gas is a mixture gas constituted of $O_2$ and TEOS and the second gas is $O_2$.

4. The substrate processing apparatus according to claim 1, further comprising an exhaust duct which has such a shape as to surround the stage as viewed in plan, and through which the first gas and the second gas are discharged out of the chamber.

5. The substrate processing apparatus according to claim 1, wherein the first gas supply part is a first mass flow controller and the second gas supply part is a second mass flow controller.

* * * * *